United States Patent [19]

Morris et al.

[11] Patent Number: 4,898,838

[45] Date of Patent: Feb. 6, 1990

[54] METHOD FOR FABRICATING A POLY EMITTER LOGIC ARRAY

[75] Inventors: Francis J. Morris, Plano; Stephen A. Evans, Dallas, both of Tex.

[73] Assignee: Texas Instruments Incorporated, Dallas, Tex.

[21] Appl. No.: 787,872

[22] Filed: Oct. 16, 1985

[51] Int. Cl.[4] .................. H01L 21/20; H01L 21/265; H01L 29/56; H01L 29/64

[52] U.S. Cl. ........................... 437/31; 437/39; 437/46; 437/47; 437/48; 437/50; 437/60; 437/175; 437/918; 357/51

[58] Field of Search ............... 148/DIG. 136; 437/31, 437/39, 46, 47, 48, 49, 50, 52, 60, 175, 192, 193, 194, 918; 357/51

[56] References Cited

U.S. PATENT DOCUMENTS

| | | | |
|---|---|---|---|
| 3,906,540 | 9/1975 | Hollins | 357/15 |
| 4,063,967 | 12/1977 | Graul et al. | 148/1.5 |
| 4,157,269 | 6/1979 | Nina et al. | 148/1.5 |
| 4,188,707 | 2/1980 | Asano et al. | 29/571 |
| 4,214,256 | 7/1980 | Dalal et al. | 357/71 |
| 4,424,579 | 1/1984 | Roesner | 365/105 |
| 4,425,379 | 1/1984 | Vora et al. | 427/84 |
| 4,451,326 | 5/1984 | Gwozdz | 156/643 |
| 4,504,332 | 3/1985 | Shinada | 148/187 |
| 4,516,223 | 5/1985 | Erickson | 365/175 |
| 4,569,123 | 2/1986 | Ishii et al. | 29/578 |
| 4,579,600 | 4/1986 | Shah | 437/19 |

FOREIGN PATENT DOCUMENTS

55-113372 9/1980 Japan .
60-74466 4/1986 Japan .

OTHER PUBLICATIONS

Bhatia et al., IBM Tech. Disc. Bull., 18, (Oct. 1975), 1403.

IBM Tech Bulletin, vol. 19, No. 6, Nov. 1976, "Gated Exclusive OR Circuit", F. H. Lohrey and G. J. Robbins.

IEEE Jnl of SS Circuits, vol. SC-20, 10/85, "A 150—ps 9000 Gate ECL Masterslice", Walter Brackelmann et al.

Primary Examiner—Olik Chaudhuri
Attorney, Agent, or Firm—Richard L. Donaldson; N. Rhys Merrett; Melvin Sharp

[57] ABSTRACT

A Schottky diode includes a metal layer (62) on an epitaxial region (24). The metal layer (62) is covered with a dielectric layer (64). An area (90) on the metal is exposed by opening a via (68) in the dielectric. The exposed area (90) is spaced from a buried perimeter (92) of the metal layer (62). A conductive lead (86) is formed in the Schottky via (68). A poly emitter terminal (46) connects a small sized emitter (50) formed in an epitaxial region (24) to the exterior. Poly emitter (46) presents a large area (76) to the exterior for alignment with a via (66) through a passivating dielectric layer (64), thus alleviating alignment problems.

11 Claims, 4 Drawing Sheets

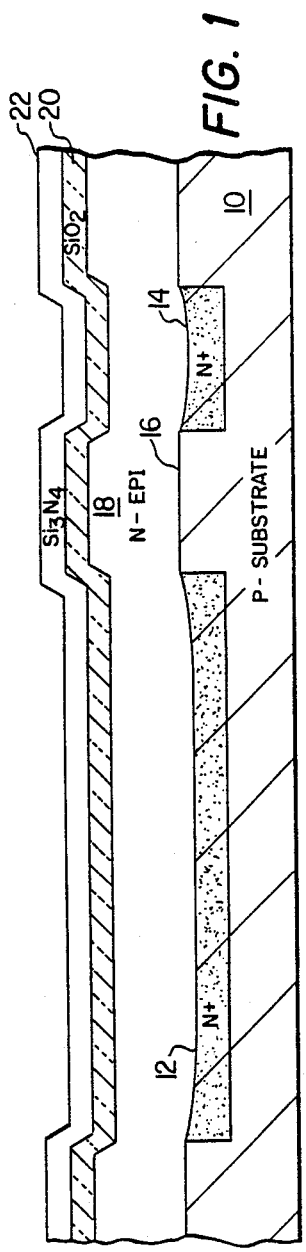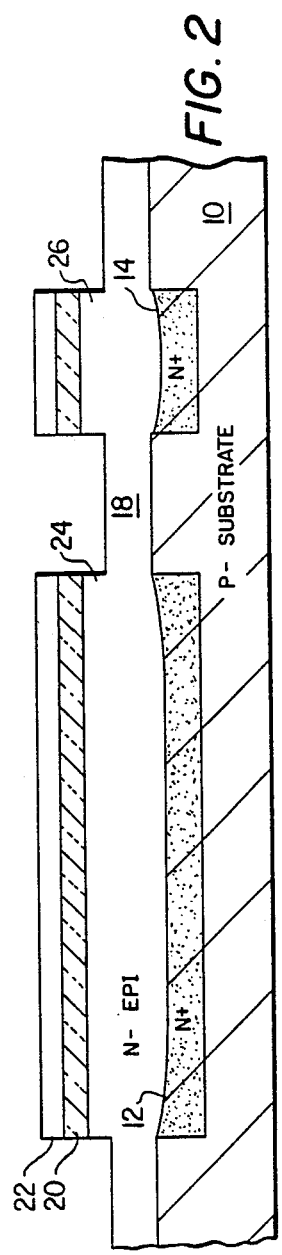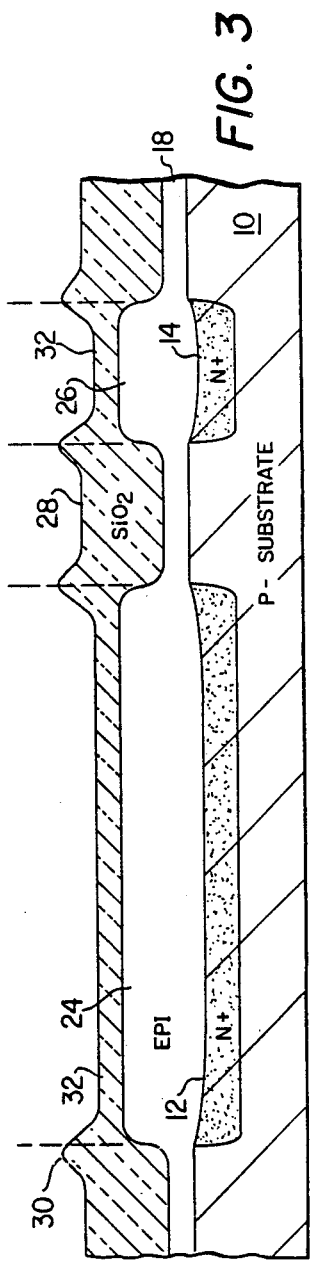

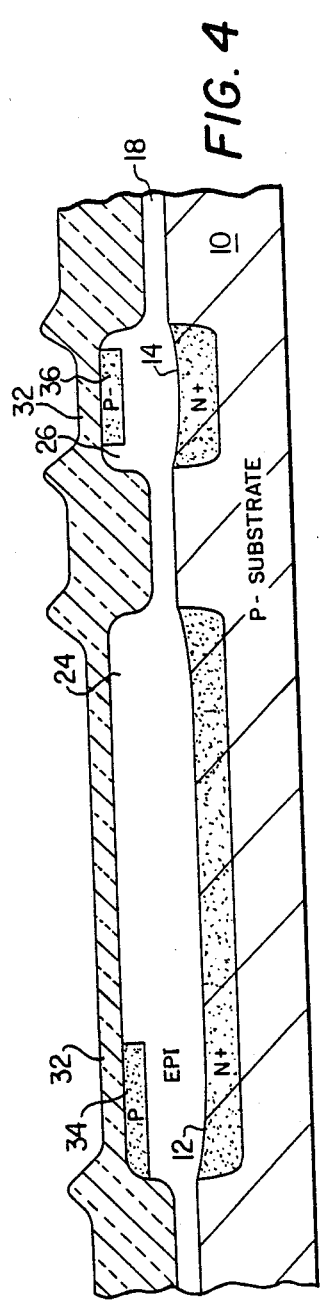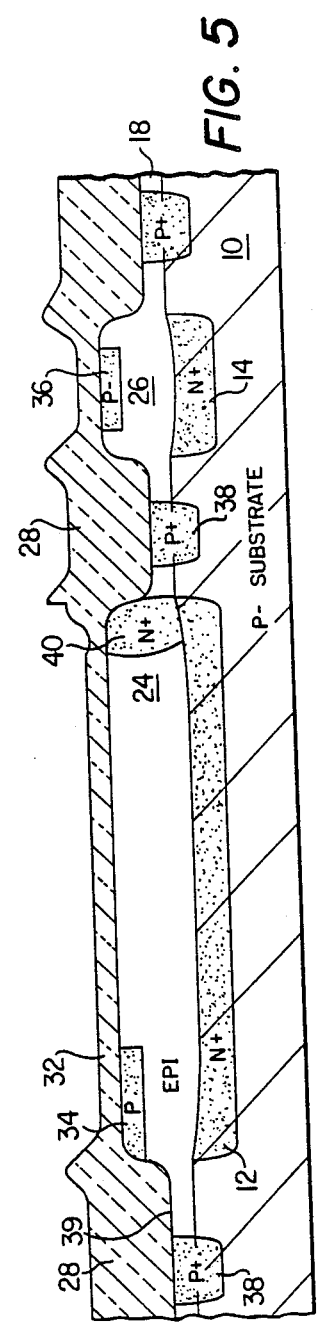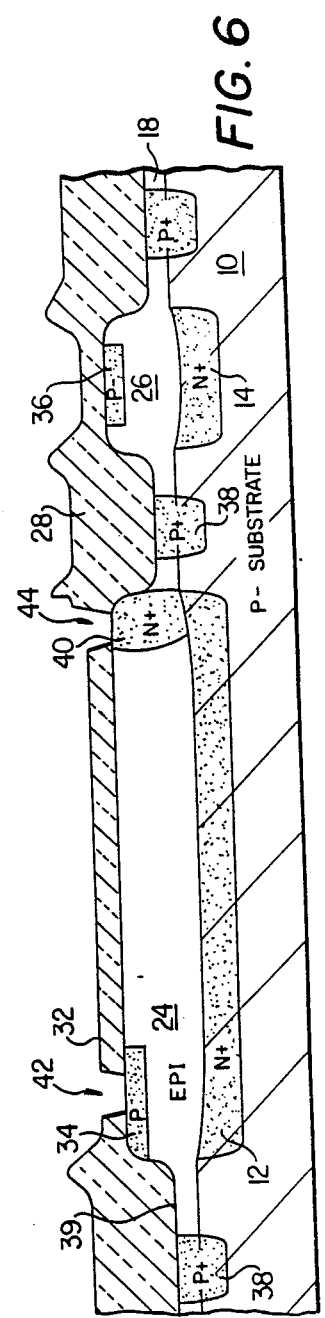

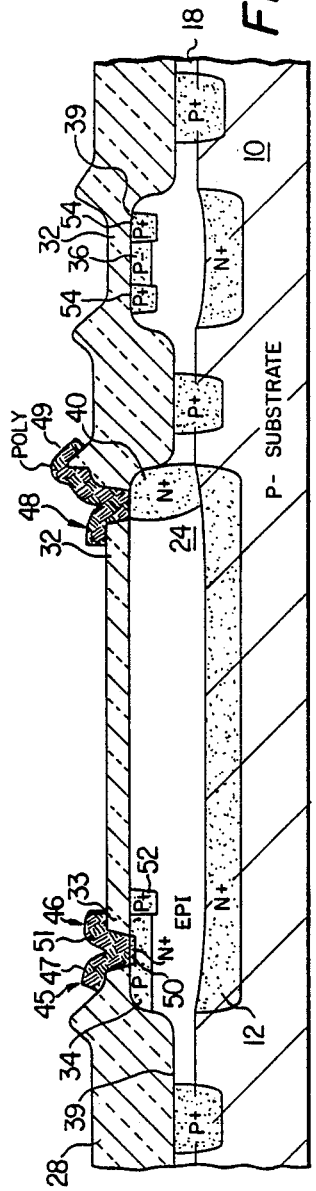
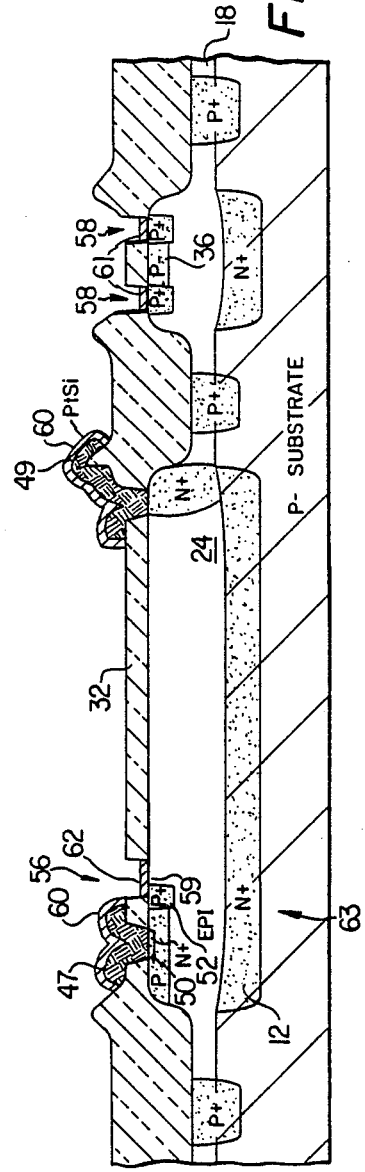
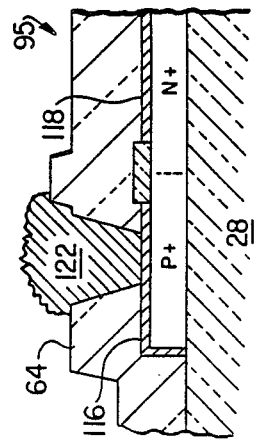
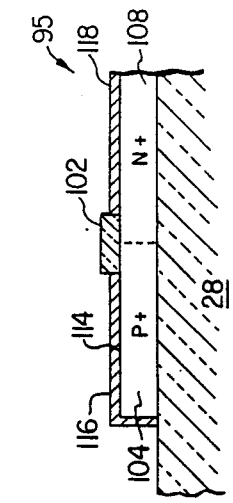
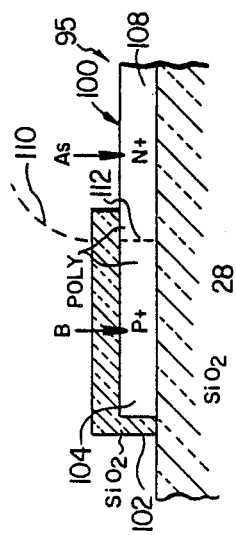

METHOD FOR FABRICATING A POLY EMITTER LOGIC ARRAY

TECHNICAL FIELD OF THE INVENTION

The present invention pertains to the fabrication of integrated circuits and more particularly pertains to the fabrication of passivated logic arrays having polycrystalline silicon contacts.

CROSS REFERENCE TO RELATED APPLICATION

This application is related to patent application Ser. No. 787,872.

BACKGROUND OF THE INVENTION

A conventional approach to the fabrication of integrated Schottky transistor logic arrays is to fabricate a "master slice" logic array, including all active devices. Thereafter, the surface of the master slice is passivated by a passivation layer and stored pending programmation of the slice. The slice is custom-programmed by selectively opening vias to particular devices.

When emitter areas and other critical components are scaled down to one micrometer size, there is a problem in finding them under the passivation layer. Chances are therefore increased that a misalignment between the emitter via and the emitter contact surface will occur, in turn increasing the chance that a less-than-ideal connection will be made. It has therefore been unfeasible to passivate highly miniaturized master slices and store them for future, custom programmation steps. Instead, logic arrays having extremely small controlling dimensions must be custom programmed immediately without an intervening passivation step. If a passivating layer such as nitride or oxide is not deposited on the slice surface, non-programmed semiconductor devices present on the chip must be circumvented by the leads. This decreases routing channel flexibility.

Another problem associated with fabrication, passivation and later custom programmation of Schottky transistor logic arrays is inadequate passivation of the Schottky diodes. The Schottky diodes are generally formed by depositing a layer of metal next to a lightly doped area of semiconductor material. The type of metal deposited on the semiconductor material determines the height of the Schottky diode barrier. Platinum Silicide (PtSi) has a higher Schottky diode characteristic than aluminum, a typical contact metal. Where a high-barrier Schottky diode is desired to be fabricated, it is therefore important to prevent low barrier metal from circumventing the high-barrier metal Schottky contact pad. If established, a low barrier Schottky diode will dominate the operating characteristics of the diode junction.

In a conventional process, a first, high-barrier metal such as platinum, iridium or palladium is deposited in the Schottky diode contact. Where platinum is used, platinum silicide (PtSi) forms on contact. A premetal cleanup dip is then done before the deposition of the second metal. This dip can etch the oxide surrounding the first metal pad, exposing the underlying semiconductor. When a second metal such as aluminum or titanium/tungsten composite (Ti-W) is used as a lead to the device, filling the diode contact, the second metal may contact the semiconductor where the oxide has been etched.

Aluminum and Ti-W have lower barrier diode characteristics than PtSi. Any contact between them and the semiconductor will create a low-barrier diode that dominates or "shorts out" the high barrier PtSi diode. The risk of high barrier Schottky diode shortout decreases quality control of the finished slice.

Another problem associated with the decreasing size of integrated circuit emitters is emitter-collector shortout. In order to provide an ohmic contact with each active region of a semiconductor device, a contact region of highly doped material is provided. However, for proper formation of the space charge region, the emitter also needs to retain a less heavily doped, active region. As the entire emitter is scaled down in size, problems arise in separating the different dopant concentrations found in the emitter and emitter contact regions, so that the highly doped emitter contact region may spike through the base to the collector region. Since high concentrations of dopant increase conductivity, the emitter-collector junction is shorted out.

In view of the above problems, a need has arisen to develop a process for fabricating a Schottky transistor logic array having small dimensional size but enhanced quality control. A further need exists to provide a process whereby a Schottky transistor logic array may be stored in a passivated state pending custom programmation.

SUMMARY OF THE INVENTION

According to one aspect of the invention, a Schottky diode is fabricated by forming a conductive layer on an area of semiconductor material. The conductive layer is then covered with a dielectric layer, passivating the region. Upon programmation, a via is opened to contact a central area of the conductive layer, avoiding the edges of the conductive layer. Thereafter, a conductive lead is deposited in the via in order to make contact with the Schottky diode.

According to another aspect of the invention, a polysilicon terminal for a semiconductor device is fabricated which substantially eliminates or reduces via alignment problems present in highly miniaturized, passivated master slices. An insulating layer is formed on the semiconductor layer and a semiconductor contact region is formed in the semiconductor layer adjacent the insulating layer. An orifice is then opened through the insulating layer to the contact region. A polysilicon body is then formed to extend into the orifice and contact the contact region. The polysilicon body may be previously or subsequently doped in order to provide a relatively conductive path to the contact region. The doped polysilicon body may serve as a source of dopant to create a further component of the semiconductor device.

BRIEF DESCRIPTION OF THE DRAWINGS

For a more complete understanding of the present invention and the advantages thereof, reference is now made to the following description taken in conjunction with the accompanying Drawings in which:

FIGS. 1-9 are schematic elevational sections of a substrate, depicting progressive steps in the fabrication process of the invention;

FIGS. 12-14 are schematic elevational sections of a substrate in the same general fabricating field as the substrate depicted in FIGS. 1-8, showing progressive steps in a process for fabricating a ROM diode.

DETAILED DESCRIPTION OF THE INVENTION

Figure 11:
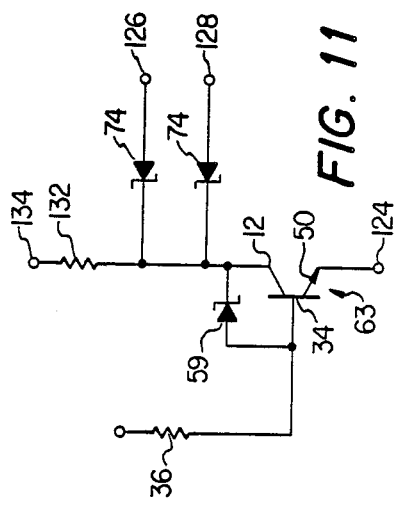
FIG. 11 is a schematic electrical diagram of the device fabricated in the steps shown in FIGS. 1-10.

Referring to FIG. 1, there is shown a lightly doped P— type substrate 10 which is manufactured through conventional processes. The P— substrate will preferably have a resistivity of 10 to 15 Ohms/square. A 2500 to 5000 Angstrom layer of silicon dioxide (hereinafter, "oxide") (not shown) is grown, and the oxide is patterned for a buried collector region 12 and a resistor tank region 14. Twenty-five hundred Angstroms of oxide are plasma etched in the patterned areas, and an N-type dopant such as antimony is implanted into collector 12 and resistor tank region 14. The structure is then annealed at 1250° C. for 25 minutes under an oxygen atmosphere. This anneal step activates the antimony to turn areas 12 and 14 into N+ doped regions. During the antimony anneal, heavily doped regions 12 and 14 oxidize faster than the lighter doped substrate regions 10, and therefore shallow depressions are left in regions 12 and 14.

The oxide is then wet stripped and 500 Angstroms of substrate 10 is vapor etched with hydrogen chloride in order to provide a clean surface 16. One micrometer (10,000 Angstroms) of an 0.3 Ohm/square N— epitaxial silicon layer 18 is then grown on surface 16. Layer 18 will include depressions which generally correspond to the shallow depressions formed in regions 12 and 14. Next, an oxide layer 20, typically between 600 and 1100 Angstroms thick, is grown by a steam treatment at 900° C. A nitride ($Si_3N_4$) layer 22 is deposited on top of oxide layer 20 by a low-pressure chemical vapor deposition (LPCVD) process.

By this point in the conventional process, an implantation of P+ channel stops would already have been done. These channel stops are normally implanted between N+ areas 12 and 14 in order to prevent the formation of parasitic metal oxide semiconductor field effect transistors. According to the present invention, these P+ channel stops are implanted during a later step.

Turning now to FIG. 2, epitaxial layer 18 is patterned in order to preserve semiconductor device regions 24 and 26 over substrate areas 12 and 14, respectively. A plasma etch is then done, cutting through about 1100 Angstroms of nitride layer 22, about 1100 Angstroms of oxide layer 20 and about 3850 Angstroms of epitaxial layer 18. This etch defines and separates raised active-device epitaxial regions 24 and 26.

Referring to FIG. 3, an oxide layer 28 about 7000 Angstroms thick is grown in all areas not covered by remaining nitride layer 22 (oxide does not grow on a nitride layer). A thicker oxide layer 28 could be grown down to substrate 10 in order to completely oxide-isolate device regions 24 and 26. Nitride layer 22 masks the device regions 24 and 26 from thick field oxide layer 28. Nitride layer 22 is thereafter removed and oxide layer 20 is wet stripped from active device regions 24 and 26. Oxide layer 20 is removed because, as shown by bird's beaks 30, it has been greatly stressed in the earlier process steps and needs to be replaced for proper quality control. Therefore, an oxide layer 32 about 600 Angstroms thick is regrown over active device regions 24 and 26.

Referring to FIG. 4, a P base region 34 is patterned with a thick photoresist implant mask (not shown) and boron is implanted through oxide layer 32. The P base photoresist mask is then removed. Next, a P resistor 36 is patterned with another thick photoresist and boron is implanted here also. Two different patterns and implantations are used because P resistor 36 is doped with a smaller concentration of boron than P base region 34. The photoresist mask is then stripped. Base region 34 is patterned such that it occupies only a segment of active device region 24. The energy of the implanted boron dopant is such that P base region 34 is spaced from collector region 12 and P resistor region 36 is spaced from resistor tank region 14.

Turning now to FIG. 5, the next step in the preferred sequence is to pattern P+ channel stops 38.

The channel stop formation process is done at this point rather than earlier to obtain better control of surface concentrations at an oxide-epitaxial surface 39 and therefore better control of the threshold voltage for the device. This sequencing of the channel stop formation also prevents the lateral diffusion of boron, as would occur if the channel stop implants had been done before the growth of epitaxial silicon layer 18 (FIG. 1). This lateral diffusion occurs in the prior art process because the epitaxial process requires a very high temperature. A resist mask sufficient to mask a high energy implant is used, as boron is implanted at high energy through oxide pad areas 28 in this step. The P+ channel stop photoresist mask is thereafter removed. Next, 3000 Angstroms of plasma oxide (not shown) are deposited to act as a mask for a deep N+ collector contact 40. This 3000 Angstrom oxide layer of oxide is patterned, and then 3600 Angstroms of oxide is plasma etched, changing the profile of oxide layer 32 above collector contact 40 as shown. Collector contact 40 is doped through a $POCl_3$ diffusion for 25 minutes at 950° C. under an oxygen and nitrogen atmosphere. Collector contact 40 is formed so as to provide a conductive path to deep collector region 12 and so as to be spaced from P base region 34. This step also activates the boron implants in P+ channel stop regions 38, base region 34 and resistor 36.

Referring to FIG. 6, orifices 42 and 44 are next patterned and plasma etched down to P base region 34 and collector contact region 40. Approximately 3600 Angstroms of oxide 32 is removed.

In FIG. 7, a layer 45 of polycrystalline silicon (or "poly" as it is known in the art) about 2000 Angstroms thick is deposited by low-pressure chemical vapor deposition (LPCVD). Emitter and collector poly terminals 46 and 48 are then patterned and heavily implanted with arsenic to make them N-type. Layer 45 is then plasma etched to define terminals 46 and 48 and annealed at 1000° C. for 20 to 30 minutes under a nitrogen atmosphere. The poly layer 45 may be implanted with arsenic and annealed before it is patterned. The anneal diffuses the arsenic out of the polysilicon bodies 46 and 48 into P base region 34 and collector contact region 40, respectively. Arsenic diffusion into collector contact region 40 improves the Ohmic contact between region 40 and poly terminal 48. The arsenic diffusion from poly terminal 46 into P base region 34 creates an N-type emitter region 50.

Poly emitter terminal 46 and emitter region 50 comprise the emitter of the transistor, although the space charge region of the emitter is restricted to N+ emitter region 50. Poly emitter terminal 46 provides good Ohmic contact with emitter region 50 from the exterior. Poly terminals 46 and 48 present larger surface areas 47 and 49 to the exterior than N+ emitter region 50 and N+ collector contact region 40, respectively. During custom metallization after the master slice has been completed and passivated, the large areas 47 and 49 provide bigger targets to "hit" through the passivation layer (later described), reducing misalignment problems during metallization.

To further enhance process tolerance, poly terminals 46 and 48 can be laterally extended over oxide layer 28 to inactive areas of the wafer. The corresponding leads 86 (see FIG. 9) would then be aligned to make contact with poly terminals 46 and 48 in these inactive areas. If a problem such as spike-through of the poly or misalignment occurs, the device in region 24 will be unaffected.

Next, the P+ regions are patterned, including a base P+ region 52 and resistor P+ regions 54. Boron is used to implant these P+ regions through oxide layer 32. Base P+ region 52 and resistor P+ region 54 are formed adjacent to epitaxial oxide surface 39. Base P+ region 52 provides a conductive contact point for base 34. It is spaced from collector 12, emitter region 50 and is in this embodiment far removed from collector contact region 40. Resistor P+ regions 54 provide good ohmic contacts to P resistor 36. After the boron is implanted into P+ regions 52 and 54, the photoresist is stripped and the structure is annealed at approximately 900° C. under a nitrogen atmosphere. This low temperature anneal activates the boron implants.

Turning now to FIG. 8, a Schottky/base orifice 56 and P+ resistor region vias 58 are next patterned. Orifice 56 is patterned so that a portion of oxide layer 32 is removed down to epitaxial layer 18 to expose both an area on base contact region 52 and an area on an unimplanted region 59 of active device region 24. After patterning, orifice 56 and vias 58 are plasma etched into oxide layer 32.

Next, platinum is deposited on the wafer, coating the silicon exposed in orifice 56, and resistor vias 58 and coating poly surfaces 47 and 49. The wafers are then heated to a temperature ranging between 450° C. and 525° C. to form platinum silicide (PtSi) layers 60, 61 and 62 on polysilicon surfaces 47 and 49, and on exposed areas of regions 52, 54 and 59. PtSi layers 60 make a good Ohmic contact with the heavily doped polysilicon surfaces 47 and 49. Platinum silicide will not form on oxide layer 32, thereby assuring that a space will remain between PtSi layer 60 and PtSi layer 62 in orifice 56. Layer 32 is deep enough with respect to the thickness of layers 60 and 62 to prevent contact between layers 60 and 62.

PtSi layer 62 provides a good ohmic contact to base P+ region 52 and at the same time creates a Schottky diode to N− epitaxial region 59. This Schottky diode will clamp the base during operation of the transistor so that the transistor does not go heavily into saturation. PtSi layers 61 form a good ohmic contact with P+ resistor regions 54. Layers 60–62 may alternately be formed of palladium or iridium silicide.

With the exception of the low-barrier Schottky logic diodes (later described), the logic array has at this stage been completed. The logic array includes a plurality of Schottky transistors 63 and a like plurality of resistors 36. Resistor 36 and its P+ regions 54 have been fabricated in only one step additional to the process of fabricating Schottky transistor 63 alone: implanting P− resistor region 36.

Figure 9:
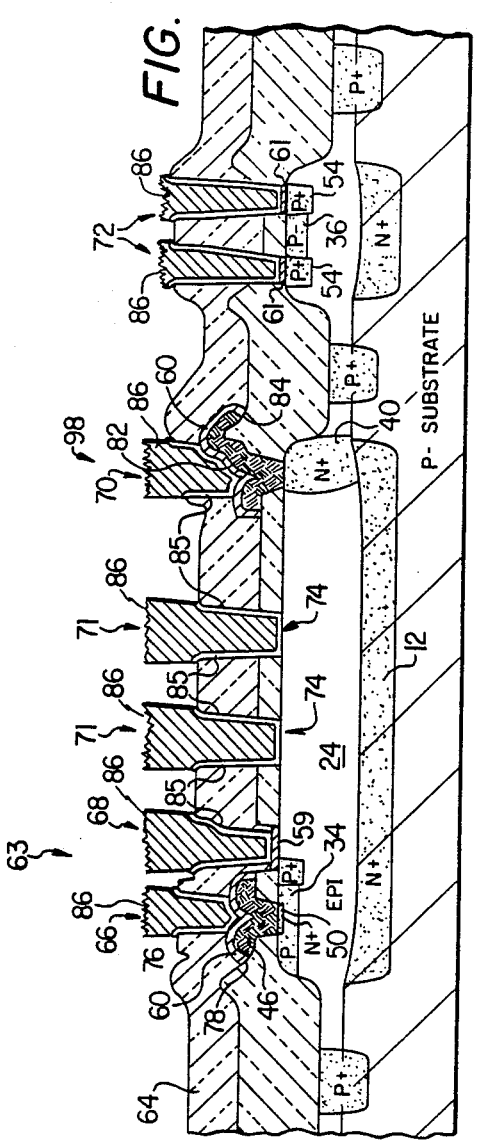

In FIG. 9, the last steps of the basic process of the invention are illustrated. A layer 64 of oxide, about 6000 angstroms thick, is deposited over the entire structure for passivation, i.e., for preventing contamination of the device. Deposited oxide layer 64 could be replaced with a dual layer of undoped and doped deposited oxide, a dual layer of oxide and nitride, or a tri-layer of undoped oxide, doped oxide and nitride.

After passivating and insulating layer 64 has been deposited, the master slice can be stored until it is metallized per the customer's requirements. To custom program a ROM, vias are opened through layer 64 on a selective basis to devices 36 and 63 underneath. Layer 64 thus allows additional lead routing flexibility over devices which are not used in a particular custom process. Layer 64 is thick enough to prevent any parasitic effects such as stray capacitance.

FIG. 9 illustrates how vias or orifices 66–72 are opened to access the active regions of the device. These vias are fabricated by patterning and plasma etching insulating layer 64. In the case of the poly emitter terminal 46, a via 66 is patterned such that it will expose an area 76 on PtSi layer 60 well spaced from a layer perimeter 78. This prevents the spike-through of metal through a partially etched peripheral area of oxide layer 32 to epitaxial region 24 by a subsequently deposited metal lead. Similarly, a via 70 to metal contact layer 60 of collector terminal 48 is patterned such that it will form an area 82 on metal contact 60 which is well spaced from a perimeter 84 of the metal contact 60.

Two vias 71 are shown that make contact to lightly doped regions at points in active device tank 24 removed from base region 34, P+ region 52 and collector contact region 40. These regions will form low-barrier Schottky logic diodes 74 once metal is deposited in vias 71. Although only two logic diodes 74 are shown for simplicity, up to between five and eight logic diodes can be fabricated. The horizontal extent of active device tank 24 and collector 12 are increased with each additional logic diode 74. Two vias 72 are opened up to access PtSi resistor contacts 61.

Figure 10:
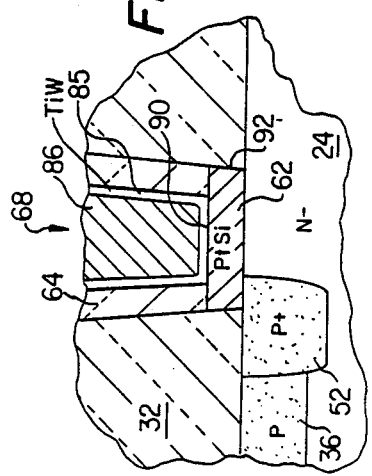
FIG. 10 is a sectional detail of FIG. 9, showing the structure of the buried Schottky diode of the invention.

The method of making base/Schottky via 68 is better shown in FIG. 10. Via 68 is formed in insulating and passivating layer 64 such that its dimensions will be smaller than earlier orifice 56 (FIG. 8). Therefore, via 68 defines an area 90 on Schottky/base PtSi contact layer 62 which is spaced from a contact layer perimeter 92. The sizing of via 68 therefore "buries" PtSi contact 62 such that a lower barrier diode metal such as an aluminum lead 86 or a Ti-W layer 85 (partially shown) cannot circumvent contact 62 when it is deposited in via 68. As previously discussed, any contact made between N− epitaxial layer 24 and a low barrier metal will tend to short out the high-barrier diode formed by PtSi contact 62 and region 24.

After the vias 66–72 have been formed in layer 64, a layer of titanium/tungsten composite (Ti-W) is deposited over the wafer, making contact to transistor 63, resistor 36 and logic diodes 74 through vias 66–72. The deposition of Ti-W is followed by another layer of first level metal, typically composed of 98% Al–2% Cu. The Ti-W and Al-Cu layers are then patterned and etched using conventional plasma processes to leave Ti-W layers 85 and Al-Cu leads 86 extending into vias 66–72. The contact of Ti-W layers 85 in vias 71 with N-type epitaxial material forms a plurality of low-barrier Schottky logic diodes 74. Low barrier diodes 74 (only two shown, although there are more typically five per transistor) are used to perform the logic functions in Schottky Transistor Logic (STL). The remainder of the metallization levels are completed using conventional multilevel processes.

FIG. 11 depicts the Schottky logic array device fabricated according to FIGS. 1–10. Like parts are numbered with like numerals. A transistor 63 has a base 34, a collector 12 and an emitter 50. Emitter 50 is connected to emitter terminal 124. A high-barrier PtSi Schottky diode 59 is connected between base 34 and collector 12, and prevents transistor 63 from going into heavy saturation. A plurality of low-barrier Ti-W Schottky logic diodes 74 (two shown) are connected between collector 12 and logic terminals 126 and 128. A resistor 36 is connected between base 34 and a base terminal 130, and a resistor 132 is connected between collector 12 and a collector terminal 134.

FIGS. 12–14 depict a modification of the basic process depicted in FIGS. 1–10, whereby an on-chip polysilicon ROM diode 95 can be fabricated during the process. Referring to FIG. 12, a polycrystalline silicon layer 100 is deposited on another region of thick field oxide layer 28 at the same time that polysilicon layer 45 (FIG. 7) is deposited. Next, an oxide layer 102 is deposited to cover a future anode 104 of ROM diode 95. Layer 102 is patterned to mask anode 104 from a subsequent anode/emitter implant. At the time that arsenic is implanted in polysilicon bodies 46 and 48, arsenic is also implanted in a cathode region 108 of ROM diode 95, to make the cathode N type. Cathode region 108 is adjacent anode region 104.

Next, a photoresist mask 110 (shown in phantom) is placed to cover anode 108. A boron implantation is then made through insulating layer 102 in order to make anode 104 P type.

In one embodiment, the boron implant into anode 104 is combined with the boron implant into P+ contact regions 52–54 (FIG. 7). The boron implant energy is adjusted such that it penetrates oxide layer 32 but is insufficient to penetrate both a portion 51 of polysilicon emitter 46 and a portion 33 of oxide layer 32 underneath poly emitter portion 51. This self-aligned process eliminates an otherwise necessary masking and implant step.

Returning to FIG. 12, ROM diode 95 is annealed at the same time and under the same conditions that polysilicon bodies 46 and 48 are annealed. This diffuses arsenic ions from cathode 108 underneath insulating layer 102 into anode 104, establishing a PN junction 112 in an area covered by oxide layer 102. In an alternate embodiment, the aforementioned single-step boron implant into regions 52, 54 and 104 can be done after this anneal, which would reduce the diffusion of dopant from P+ base region 52 (FIG. 7) into epitaxial region 24. This would lower capacitance and increase the collector-base breakdown characteristic of Schottky transistor 63.

Referring to FIG. 13, oxide layer 102 is masked to expose a contact surface 114 of anode 104, and a corresponding portion of oxide layer 102 is removed. Then, PtSi (or other metal silicide) layers 116 and 118 are deposited on anode surface 114 and cathode 108 at the same time that PtSi or other metal silicide layers are deposited on polysilicon bodies 46 and 48 and in base/Schottky orifice 56 (FIG. 8).

In FIG. 14, the finished ROM diode 95 is covered with insulating and passivating layer 64 together with Schottky transistor 63. The master slice, which includes a plurality of ROM diodes 95 and a plurality of Schottky transistors 63 (FIG. 9) may then be stored pending custom metallization. When it is desired to program the master slice, a ROM diode via 122 is opened to PtSi layer 116 in the case that a "1" bit is to be returned, and a metal such as Ti-W or aluminum is deposited in the via. The metal deposited in via 122 can operate as a bit line, in which case PtSi layer 118 operates as a word line.

In summary, a logic array process is disclosed which can be used for small ($\sim 1$ $\mu$m) emitter sizes and therefore compact integrated circuits in general, and which at the same time allows the storage of master slices in a passivated state. In particular, a method is disclosed for fabricating poly emitters, poly collector contact terminals and buried Schottky diodes which allow prementallization storage. Although the process of the invention has been disclosed as fabricating a Schottky transistor logic (STL) array including a Schottky transistor, a resistor, logic diodes and a ROM diode all on the same wafer, the invention may be used to fabricate other components of integrated circuits. An illustrated embodiment of the invention has been described in detail, but it should be understood that various changes, substitutions and alterations can be made therein without departing from the spirit and scope of the invention as defined by the appended claims.

What is claimed is:

1. A method of fabricating a Schottky transistor, comprising:

providing a semiconductor substrate having a collector region of a first conductivity type;

forming a semiconductor layer of the first conductivity type on the collector region, the semiconductor layer having an exterior surface and a base region within the collector region and near the exterior surface;

forming a first insulating layer on the semiconductor layer;

doping the base region to be of a second conductivity type;

heavily doping a collector contact region to be of the first conductivity type, the collector contact region being a portion to the semiconductor layer and extending from the collector region to the first insulating layer, the collector contact region being spaced from the base region;

opening first and second orifices from the exterior through the first insulating layer to the semiconductor layer, the first orifice exposing a first area formed on the base region, the second orifice exposing a second area formed on the collector contact region;

forming first and second polysilicon bodies, the first body extending into the first orifice and contacting the first area, the second body extending into the second orifice and contacting the second area, the exterior surface area of the first and second bodies being greater than the respective first and second areas;

heavily doping the polysilicon bodies with a dopant to be of the first conductivity type;

annealing the first polysilicon body and the base region such that dopant diffuses into the first area from the first polysilicon body, the diffusion creating an emitter region of a first conductivity type within the base region;

doping a second base region to be of the second conductivity type with a doping concentration that is greater than that of said base region, the second base region being a portion of the semiconductor layer adjacent to the base region and the first insulating layer and spaced from the collector and collector contact regions;

opening a third orifice in the first insulating layer to expose a third area of the semiconductor layer, the third area adjoining a portion of the second base region and a Schottky diode region adjacent to the second base region, the Schottky diode region comprising a portion of the semiconductor layer of the first conductivity type, the third area being spaced from the base and collector contact regions;

forming separate conductive layers on the polysilicon bodies and across the third area, the conductive layers having edges and central areas;

forming a second passivating and insulating layer on the conductive layers and adjacent areas of the first insulating layer and to fill the third orifice;

opening vias in the second insulating layer to the central areas of the conductive layers, the edges of the conductive layers not being exposed; and forming conductive leads in the vias to provide base, emitter, collector and Schottky diode connections.

2. The method of claim 1 wherein a polysilicon diode is also formed, the method further including the steps of:

forming a polysilicon layer on the first insulating layer during the step of forming the first and second polysilicon bodies;

forming a first diode insulating layer to cover a first portion of the polysilicon layer before the step of doping the polysilicon bodies, the first insulating layer being thick enough to prevent doping of the first portion by an implantation through the polysilicon layer;

doping a second portion of the polysilicon layer adjacent to the first portion with a dopant during the step of doping the polysilicon bodies to be of the first conductivity type;

doping the first portion of the polysilicon layer to be of the second conductivity type;

annealing the polysilicon layer during the step of annealing the polysilicon bodies, the anneal causing the second portion dopant to diffuse into the first portion between the first insulating layer and the first diode insulating layer to form a diode junction;

exposing a region of the first portion by removing a portion of the diode insulating layer during the step of opening the third orifice, the region being spaced from the diode junction;

forming separate conductive layers on the first portion region and on the second portion during the step of forming conductive layers on the polysilicon bodies;

forming a third passivating and insulating layer to cover the conductive layers and the diode insulating layer during the step of forming the second insulating layer;

opening a diode via in the third insulating layer to the conductive layer on the first portion during the step of forming vias to the central areas; and forming a conductive lead in the diode via during the step of forming leads in the vias.

3. The method of claim 1, wherein the step of doping the first portion of the polysilicon layer is performed simultaneously with the step of doping the second base region.

4. The method of claim 1, wherein the polysilicon diode is a read-only memory diode, the conductive lead in the diode via being connected to a bit line, the conductive layer on the second portion being connected to a word line.

5. The method of claim 1, wherein the step of doping the base region is performed by implanting a dopant through the insulating layer into the semiconductor layer.

6. The method of claim 1, wherein the step of doping the collector contact region is performed by implanting a dopant through the insulating layer into the semiconductor layer.

7. The method of claim 1, and further including the step of:

doping the semiconductor layer to form a channel stop of the second conductivity type, the channel stop extending from the substrate to the first insulating layer and being spaced from the collector, base and collector contact regions, the channel stop acting to prevent the operation of a parasitic field-effect transistor.

8. The method of claim 1, wherein a resistor is fabricated simultaneously on the same wafer as the Schottky transistor, the method including the further steps of:

doping a resistor region of the semiconductor layer to be of the second conductivity type, the resistor region being adjacent to the first insulating layer and having a plurality of ends;

heavily doping a plurality of second resistor regions to be of the second conductivity type, a second resistor region being adjacent to each end of the resistor region, the second resistor regions being adjacent to the first insulating layer and laterally spaced from the base, second base, Schottky diode, collector and collector contact regions, the second resistor regions being doped during the step of doping the second base region;

opening a resistor contact orifice through the insulating layer to each second resistor contact region during the step of forming the third orifice;

forming resistor contact conductive layers on each second resistor region during the step of forming the conductive layers; and forming conductive resistor leads in the resistor contact orifices during the step of forming conductive leads.

9. The method of claim 1 and further including the steps of:

opening a plurality of logic diode vias in the second insulating layer during the step of opening vias in the second insulating layer, the logic diode vias exposing portions of the semiconductor layer spaced from the base, second base, collector, collector contact and Schottky diode regions; and forming a conductive layer in the logic diode vias during the step of forming a conductive layer in the vias, the conductive layer in the logic diode vias contacting the semiconductor layer to form low-barrier Schottky logic diodes.

10. The method of claim 1, wherein the step of forming conductive leads in the vias comprises:

depositing a layer of titanium-tungsten composite in the vias; and depositing an alloy comprising aluminum over the layer of titanium-tungsten composite.

11. The method of fabricating an array of Schottky transistors each including a base, an emitter and a collector, comprising the sequential steps of:

providing a semiconductor layer;

forming an insulator layer on the semiconductor layer;

doping the semiconductor layer to form a plurality of active and contact regions, said active and contact regions including for each Schottky transistor an emitter region formed within a base region, and a collector contact region;

opening a window through the insulator layer to each of said active and contact regions, the windows defining first areas on said active and contact regions;

filling each window with a polysilicon body, each polysilicon body having an exterior area opposed to and larger than its respective first area;

doping said polysilicon bodies to provide conductive paths to said active and contact regions;

annealing each emitter polysilicon body to diffuse the dopant into the corresponding emitter region;

heavily doping the semiconductor layer to form a plurality of base contact regions, each base contact region being adjacent to a base region, each base contact region being spaced from the corresponding collector and collector contact regions;

forming separate conductive layers to cover each polysilicon body and at least portions of each base contact region and a corresponding collector region, the conductive layers each having a perimeter and a central area;

opening a plurality of Schottky diode windows in the insulating layer, a plurality of Schottky diode regions each being located in the semiconductor layer in areas defined by said Schottky diode windows and adjacent a corresponding base contact region, each Schottky diode region being spaced from the corresponding collector and collector contact regions;

forming separate Schottky layers to cover each said second area, the Schottky layers each having a perimeter and a central area;

covering the conductive layers, the Schottky layers, and surrounding areas with an insulating and passivating layer;

programming the unprogrammed array thereafter to meet specific requirements after the step of storing the array, the programming step including:

selectively opening vias in the insulating and passivating layer to the central areas of the Schottky and conductive layers and not exposing the Schottky and conductive layer perimeters; and forming conductive leads in the vias to thereby allow said Schottky transistors to be electrically interconnected so as to form a particular logic function.

* * * * *